United States Patent
Nagaraj

(10) Patent No.: US 6,441,769 B1
(45) Date of Patent: Aug. 27, 2002

(54) OVERCOMING FINITE AMPLIFIER GAIN IN A PIPELINED ANALOG TO DIGITAL CONVERTER

(75) Inventor: Krishnaswamy Nagaraj, Somerville, NJ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/745,771

(22) Filed: Dec. 22, 2000

(51) Int. Cl.[7] .............................. H03M 1/10; H03M 1/38
(52) U.S. Cl. ........................................ 341/161; 341/120
(58) Field of Search ................................. 341/120, 156, 341/161, 118, 144, 155; 330/9

(56) References Cited

U.S. PATENT DOCUMENTS

| | | | | |
|---|---|---|---|---|
| 4,604,584 A | * | 8/1986 | Kelley | ........................... 330/9 |
| 4,908,621 A | * | 3/1990 | Polonio et al. | ............. 341/120 |
| 5,534,864 A | * | 7/1996 | Ono et al. | ................... 341/156 |
| 5,635,937 A | * | 6/1997 | Lim et al. | ..................... 341/161 |
| 6,211,806 B1 | * | 4/2001 | McCarroll | ................... 341/161 |
| 6,323,800 B1 | * | 11/2001 | Chiang | ........................ 341/161 |

* cited by examiner

*Primary Examiner*—Patrick Wamsley
(74) *Attorney, Agent, or Firm*—W. Daniel Swayze, Jr.; W. James Brady; Frederick J. Telecky, Jr.

(57) ABSTRACT

An apparatus for correcting for the finite gain of an amplifier assembly in a pipelined analog to digital converter (ADC) is disclosed in which an input signal to an amplifier module of one stage of the pipelined ADC is sampled and provided to the input of an amplifier of a subsequent stage as a feed-forward error correction signal. The feed-forward correction signal is subtracted in the next stage from the output residue signal of the previous stage input to the second subsequent stage amplifier in order to remove part of the output signal from the first stage that includes the finite gain of the amplifier.

19 Claims, 6 Drawing Sheets

OVERCOMING FINITE AMPLIFIER GAIN IN A PIPELINED ANALOG TO DIGITAL CONVERTER

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

This invention relates generally to analog-to-digital converters and more particularly to pipelined analog-to-digital converters having a feed-forward correction signal propagated between stages for providing more accurate digital conversion.

Pipelined analog-to-digital converters (ADCs) are well known in the art. A typical pipelined ADC includes a series of stages, wherein each stage provides one or more output digital bits. The output digital bits from each stage taken together represent the digital value of an input signal provided to the ADC. FIG. 1 illustrates a typical pipelined ADC 100 having a first stage 102 receiving a signal input, Vin on input line 104. Each stage provides one or more output digital bits on the outputs 106 and also provides an output residue 108 that is the input for the next stage. The output residue represents the non-digitized portion of the input signal that remains after being processed by each stage. The pipelined ADC, illustrated in FIG. 1, includes N stages.

FIG. 2 illustrates a pair of typical prior art pipelined ADC stages. An input signal Vin is provided on line 202 to the first stage 201 where a N-bit ADC 204 samples the input signal and provides a N-bit digital output signal 206. A N-bit digital-to-analog converter (DAC) 208 samples the N-bit digital output and provides an analog signal 210 that is representative of the digital output signal 206. A subtraction module 212 subtracts the analog signal 210 from the input signal 202, and the difference is amplified by amplifier 214. The amplified difference signal on line 216 is the output residue of that stage. The next stage 203 receives the output residue on line 216 as an input signal and operates as described above.

Although in theory the pipelined ADC should produce nearly perfect digital representations of an input signal, in practice the components and amplifiers that comprise the pipelined ADC are not ideal. In particular, the components comprising the amplifier assemblies 214 and 228 are typically comprised of one or more operational amplifiers along with a plurality of other components such as resistors, capacitors, and switches. It is well known that operational amplifiers have a finite open-loop gain and a gain-bandwidth product that reduces the open-loop gain as the frequency increases. It is not the amplifier assembly 214 or 228 themselves that provide the errors, but rather, the components that comprise these assemblies that provide the errors.

FIG. 3 illustrates a typical amplifier topography of the amplifier block 214 or 228 as a block diagram of a high gain amplifier having a feedback network and a differential input. This configuration allows the amplifier illustrated in FIG. 3 to combine both the subtraction module 212 and 226 with the amplifier module 214 or 228 respectively in each stage illustrated in FIG. 2. One skilled in the art should recognize FIG. 3 as a block diagram of an operational amplifier configured as a difference amplifier with gain. The high gain amplifier with feedback has two inputs Vin1 301 and Vin2 303 and two input networks 302 and 305 that couple the respective inputs to a summing module 304. The output of the summing module 304 is then provided to the high gain amplifier 396, where the output of the high gain amplifier is sampled and fed back to the summing module 304 by the feedback network 308. It can be shown that the output voltage of the amplifier in FIG. 3 can be given as:

$$V_{out} = \frac{V_1 C}{B} + \frac{V_2 D}{B} - \frac{V_{out}}{A} \tag{1}$$

where A is the open loop gain of the operational amplifier, B is the feedback network transfer function 308, C is the input network transfer function 302 for the input 301, and D is the input network transfer function 305 for the input 303. If A is infinity as is commonly assumed, then the gain equation (1) simplifies to the commonly used operational amplifier gain equation.

However, if high accuracy is required in a particular applications, such as a highly accurate ADC, the non-infinite value of the gain A in the third term of equation (1) will deleteriously impact the accuracy of the output signal. In addition, because the gain, A, of the amplifier 306 rolls off at higher frequencies, high speed applications will suffer an even greater error as the value of the gain, A, in equation (1) is further reduced.

Therefore it would be advantageous to provide a pipelined ADC that did not suffer from the limitations of the operational amplifiers used within the amplifier modules of the pipelined ADC.

BRIEF SUMMARY OF THE INVENTION

An apparatus for correcting for the finite gain of an amplifier assembly in a pipelined analog to digital converter (ADC) is disclosed in which an input signal to an amplifier module of one stage of the pipelined ADC is sampled and provided to the input of an amplifier of a subsequent stage as a feed-forward error correction signal. The feed-forward correction signal is subtracted in the next stage from the output residue signal of the previous stage input to the second subsequent stage amplifier in order to remove part of the output signal from the first stage that includes the finite gain of the amplifier.

The present invention provides for an apparatus for correcting for the non-ideal characteristics of the electronic components that are used to amplify the residue output signal of a stage in a pipelined analog to digital converter (ADC). The resulting pipelined ADC is more accurate and able to operate at higher speeds because the portions of the output residue signal due to the non-ideal characteristics of the electronic components have been removed.

More particularly, a pipelined ADC is comprised of a plurality of stages connected to one another serially, wherein the stage output of one stage provides the stage input for the next subsequent stage. Each stage includes an N-bit ADC having an ADC input coupled to the stage input and an ADC output that provides an N-bit digital output signal representative of the input signal. Each stage further includes a N-bit digital-to-analog converter (DAC) having an input and an output, where the input is coupled to the N-bit digital output signal. The DAC provides an analog output signal representative of the N-bit digital output signal. Each stage further includes a subtraction module that is coupled to the stage input and the analog output signal of the DAC and provides an output to an amplifier having a gain of $2_N$ that provides, as an output, the amplified difference signal that is the output residue signal of the stage. A sampling network samples the input signal of the amplifier assembly and provides the inverse of the sampled output signal to the subtraction module of the next subsequent stage to remove that portion of the output residue signal that is due to the non-ideal characteristics of the amplifier module.

BRIEF DESCRIPTION OF THE SEVERAL VIEWS OF THE DRAWING

The invention will be more fully understood by reference to the following Detailed Description of the Invention in conjunction with the Drawing of which.

DETAILED DESCRIPTION OF THE INVENTION

The present invention is utilized within a pipelined analog to digital converter (ADC) and provides for a feed-forward error correction signal to be provided from a pre-selected first stage of the pipelined ADC to a subsequent stage. to correct for the finite gains of the operational amplifiers used to amplify the output residue of the pre-selected first stage. In the illustrated embodiments of the present invention that follow, two stages are used for illustrative purposes only. It should be recognized that any number of stages incorporating the present invention may be used within a pipelined ADC and that any number of stages may intervene between the pre-selected first stage and the subsequent stage that receives the feed-forward error correction signal.

Figure 1:
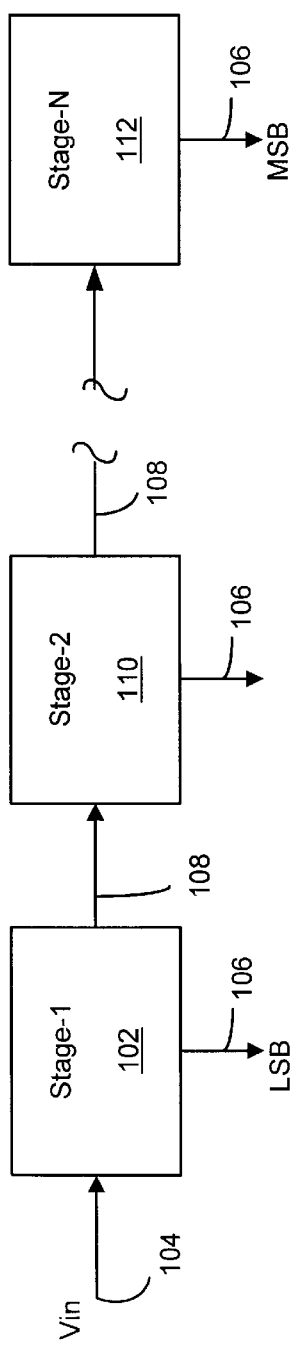
FIG. 1 is a block diagram of a prior art pipelined analog to digital converter.
Figure 2:
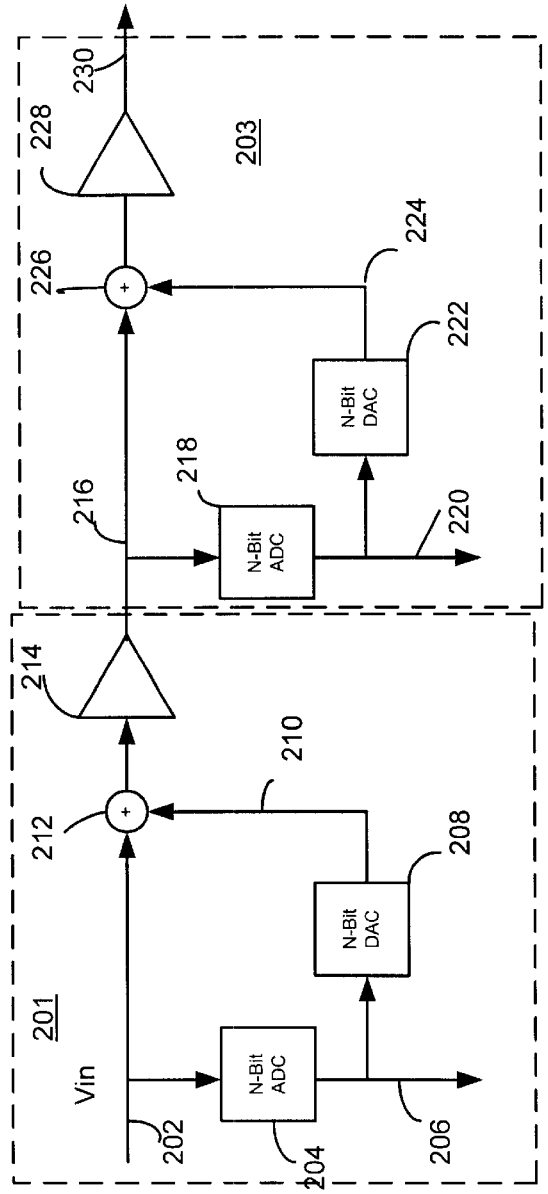
FIG. 2 is a block diagram of two adjacent stages in the prior art pipelined analog to digital converter of FIG. 1
Figure 3:
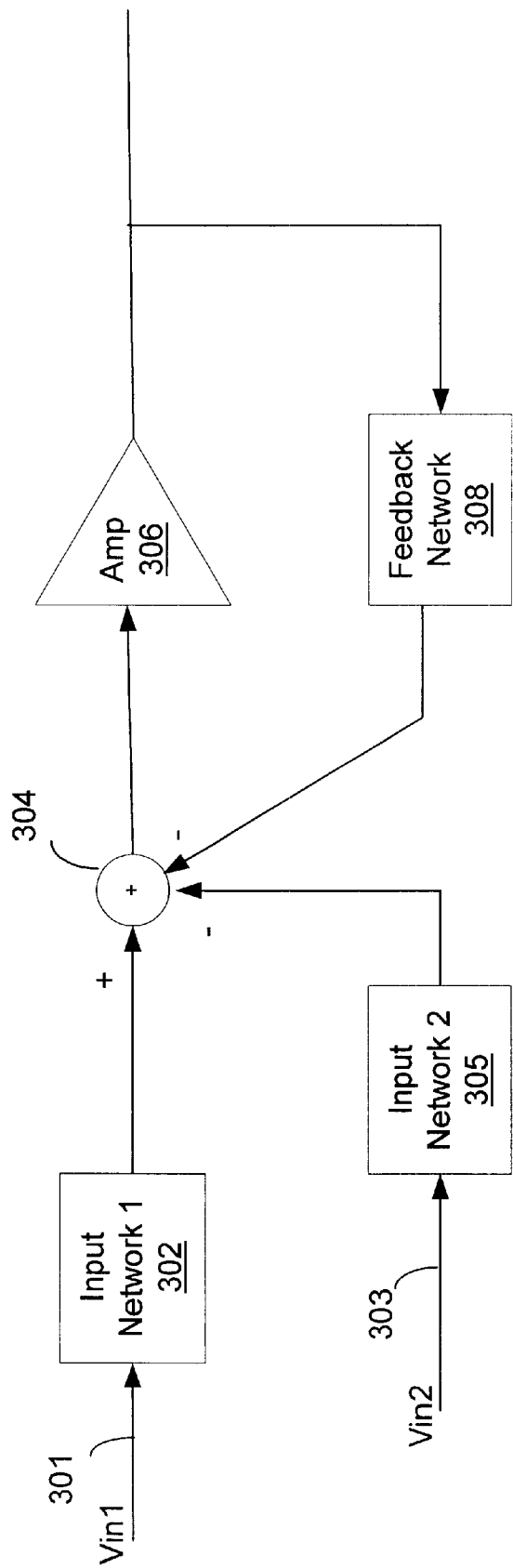
FIG. 3 is a block diagram of a feedback difference amplifier with gain suitable for use in the pipelined analog to digital converter illustrated in FIG. 2.
Figure 4:
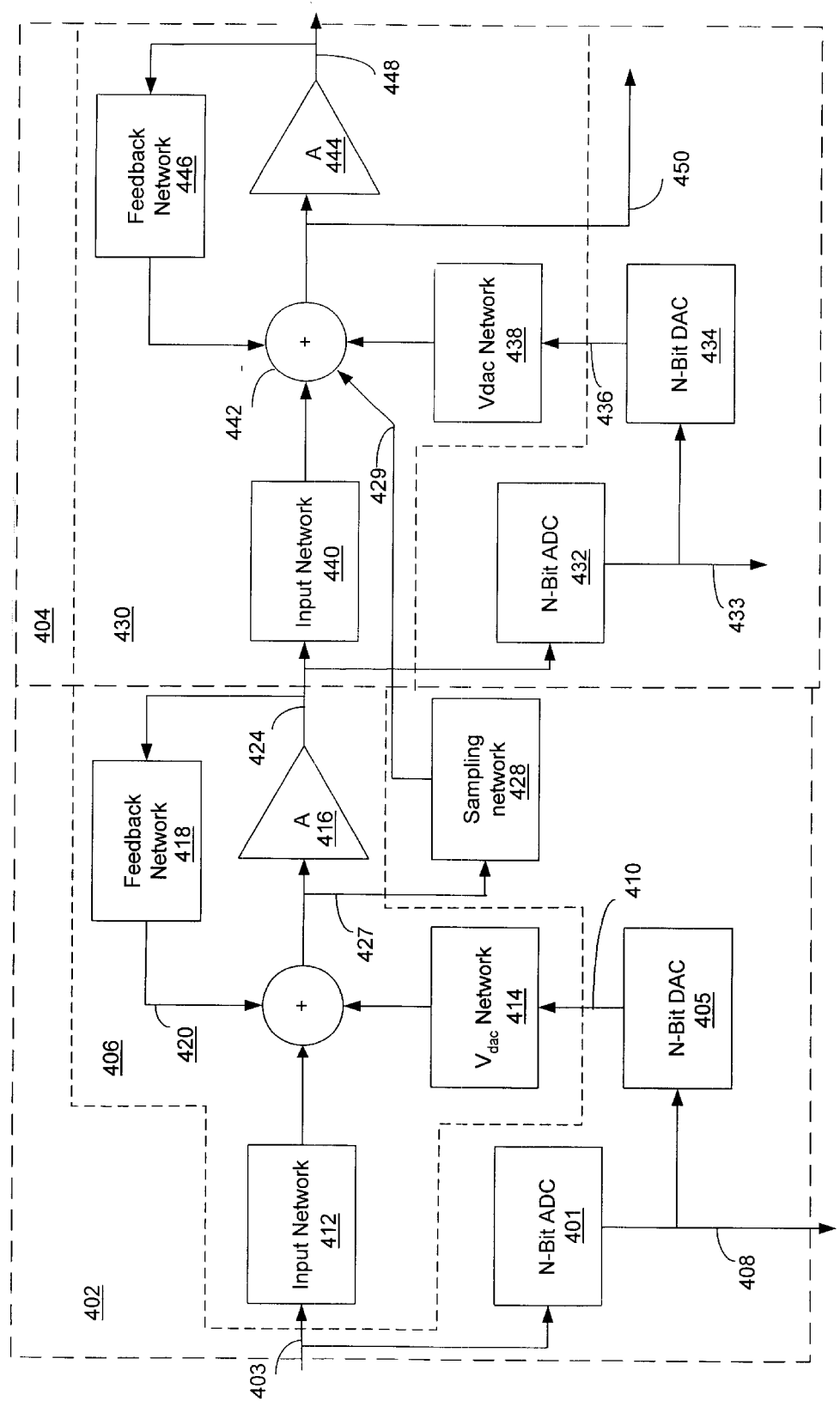
FIG. 4, is a block diagram of one embodiment of a pipelined analog to digital converter according to the present invention.

FIG. 4 illustrates two adjacent stages 402 and 404 of a pipelined analog to digital control (ADC) according to the present invention. The first stage 402 includes a first amplifier assembly 406, a N-bit ADC 401, a N-bit digital to analog converter (DAC) 405, and a sampling network 428. An input signal is provided on an input line 403. If stage 402 is the first stage in the pipelined ADC then the input signal is the analog signal to be digitized, and if stage 402 is a subsequent stage then the input signal would be a residue signal from a preceding stage. The input signal on line 403 is coupled to an input network 412, which is part of the amplifier assembly 406, and to the N-bit ADC 401. The N-bit ADC 401 provides a N-bit digital output signal 408 that represents the digital bits of the input signal for this stage of the pipelined ADC. The N-bit DAC 405 samples the digital output signal 408 and provides an analog signal $V_{DAC}$ on line 410. A subtraction module 422 receives the input signal from the line 403 via the input network 412 and the $V_{DAC}$ signal via the $V_{DAC}$ network 414. The subtraction module 422 also receives a third input that is the feedback signal on line 420. The feedback signal is provided by sampling the output signal on line 422 of the first stage amplifier module 406 via feedback network 418. The subtraction module 422 provides the difference of the input signals to the high-gain amplifier 416. The high-gain amplifier provides amplified difference signal as the output residue signal for the next stage on line 424 as discussed above.

Sampling network 428 samples the input to the high-gain amplifier 416 and provides an output signal on line 429 that is equivalent to the output of the high-gain amplifier 416 divided by the gain of the amplifier 416. The output signal on line 429 is provided as a feed-forward correction signal to the subtraction module 442 of the second amplifier assembly 430. Subtracting the feed-forward correction signal from the output residue signal of the first stage compensates for the effects of the non-infinite gain of the high-gain amplifier 416 by removing from the output residue signal those portions that are due to non-ideal characteristics of the amplifier circuitry 406. This is mathematically equivalent to removing the third term in equation (1), Vout/A, from processing by the next stage 404.

The second stage 404 includes the second amplifier assembly 430 that includes a input network 440 coupled to line 424, which is the output of the first stage 402. The input network 440 provides a first input to the subtraction module 442. A N-bit ADC 432 is also coupled to line 424 and provides a N-bit digital output representative of the signal present on the output 424. A N-bit DAC 434 samples the N-bit digital output and provides an analog signal on line 436 as another input to the subtraction module 442. As discussed above, sampling network 428 also provides the feed-forward correction factor on line 429 as another input to the subtraction module 442. Feedback network 446 also provides a feedback signal to the subtraction module 442 as well. The output of the subtraction module 442 is provided to a second high-gain amplifier 444 that provides an output on line 448 that is coupled to the feedback network 446. Additionally, if desired, a second sampling network may be coupled to line 450 to provide a second feed-forward correction signal to the subsequent stage.

Figure 5:
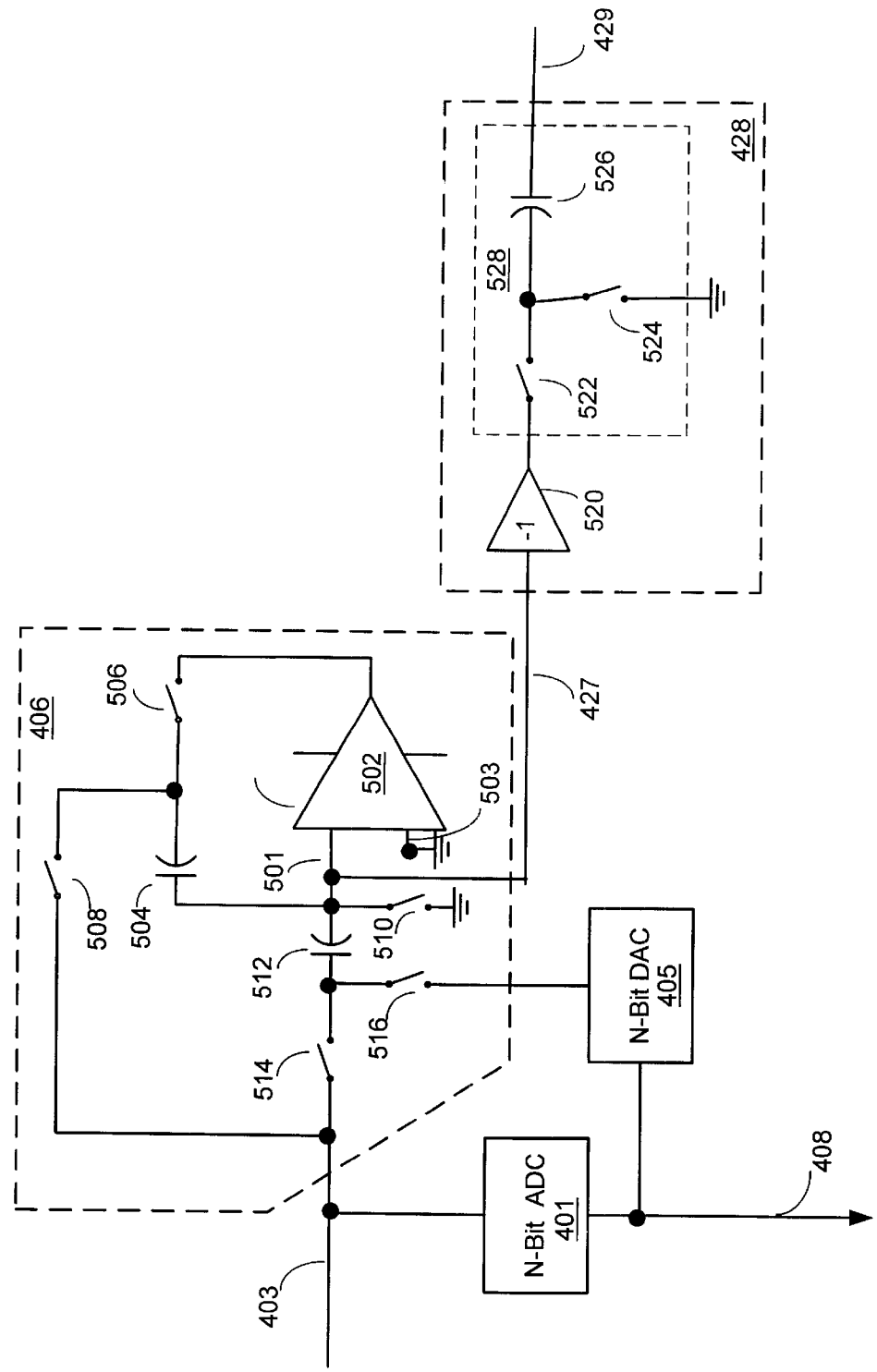
FIG. 5 is a schematic diagram of a switched capacitor difference amplifier and sampling network suitable for use in a stage of the pipelined analog to digital converter illustrated in FIG. 4.

FIG. 5 illustrates a schematic of an electronic circuit suitable for use as the amplifier assembly 406 and 430 and a schematic of a circuit suitable for use as the sampling network 428. The amplifier module 406 includes an operational amplifier 502 and a plurality of components configured and arranged as a switched capacitor amplifier that performs the required subtraction and multiplication functions. Each of the switches in the switched capacitor amplifier is switched by one of two orthogonal signals, phase-1 ($\phi_1$) or phase-2 ($\phi_2$)

The switched capacitor amplifier illustrated in FIG. 5 comprises an operational amplifier 502 having a first input 501 and a second input 503 wherein the second input 503 is electrically connected to ground. Input line 403 is coupled to switches 514 and 508, both of which switch at pi. Switch 514 couples the input line 403 to capacitor 512, which is coupled to the first input 501. The analog signal from the N-bit DAC 405 is coupled to the capacitor 512 via switch 516 that is switched at $\phi_2$. The output of the operational amplifier is coupled to the feedback capacitor 504, $C_2$, via switch 506 that switches at $\phi_2$, with the feedback capacitor 504 coupled to the first input 501 of the operational amplifier 502. Switch 508 couples the input signal on line 410 to the feedback capacitor 504. In general the capacitors 512 and 504 have the same value of capacitance. In this case, the transfer function of the amplifier module 406 is given by:

$$V_{out} = \frac{(2*V_{in})}{\left(1+\frac{2}{A}\right)} - \frac{V_{DA}}{\left(1+\frac{2}{A}\right)} \quad (2)$$

which can be rewritten as:

$$V_{out} = 2V_{in} - V_{DA} - \frac{2V_{out}}{A}. \quad (3)$$

Where $V_{DA}$ is the analog signal generated by the N-bit DAC 405 and present on line 410, $V_{in}$ is the input signal to the stage and present on line 403, and A is the open loop gain of the operational amplifier 502.

Amplifier module 430 comprises the same components as amplifier module 406, but in the subsequent stage amplifier the switches are driven with the opposite phases in order to couple the output 424 into the amplifier module 430 and to provide the same transfer function as given in equation (1).

It would be an obvious modification to utilize other operational amplifier circuit topologies to achieve the same functionality as the above described circuit. For example, the difference amplifier with gain could also be achieved using a traditional difference amplifier comprising one or more operational amplifiers with assorted resistors and capacitors. In addition, other analog circuits using other amplifying components such as transistors may be employed. The choice of the analog circuit topology would be an obvious design choice according to the system needs.

As illustrated in FIG. 5, sampling network 428 is comprised of an amplifier 520 having an input coupled to the first input 501 of the operational amplifier 502. The amplifier 520 has a gain of negative one (−1) to ensure that the sampled signal provided on line 429 to subtraction module 442 contains the opposite sign of the signal on the input 501. The amplifier 520 is coupled to a sample and hold circuit 528. The sample and hold circuit includes a sampling capacitor 526 coupled to the input 501 of the operational amplifier 502 via switch 522 that is switched by $\phi_2$. When switch 522 is closed, the sampling capacitor 526 samples the voltage on the first input 501 of the operational amplifier 502. Switch 524 then closes connecting the sampling capacitor 526 to ground and providing the signal from the switching capacitor 526 to the output line 429.

Figure 6:
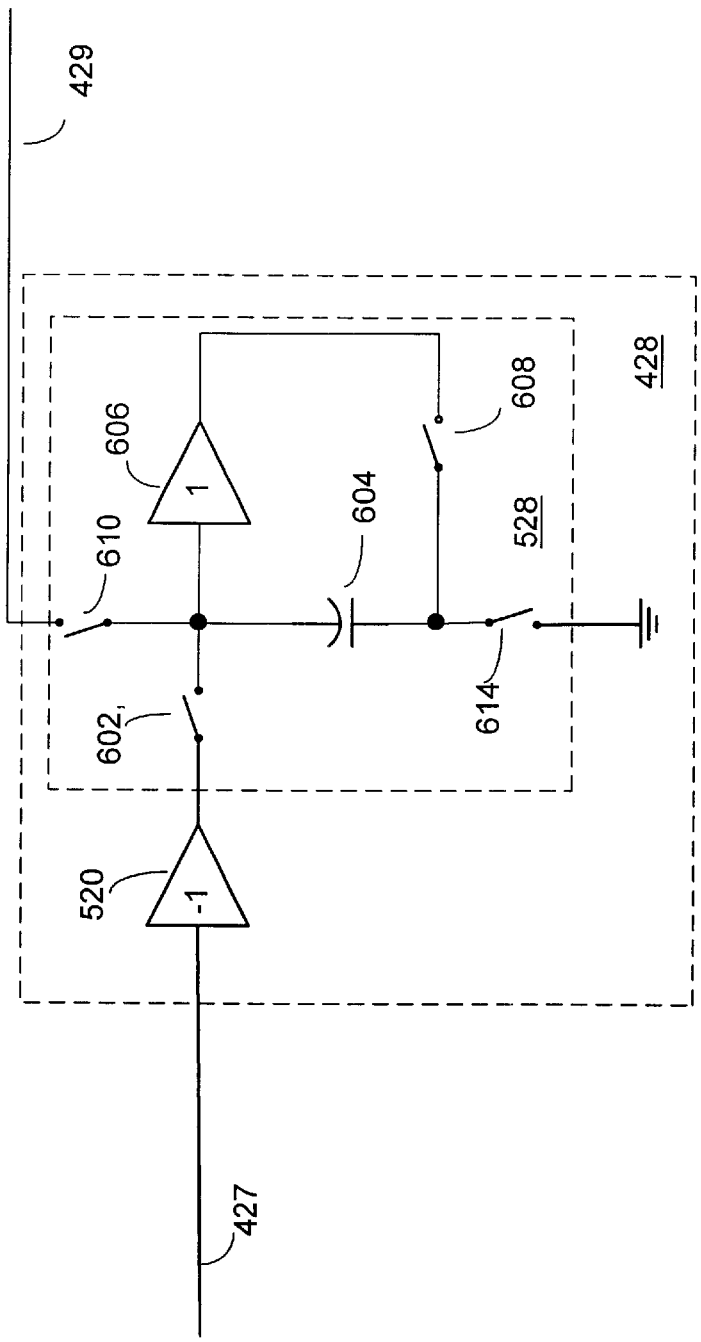
FIG. 6 is a schematic diagram of another embodiment of a sampling network suitable for use with the electronic circuit of FIG. 5.

The sampling capacitor 526 within the sampling network 428 illustrated in FIG. 5 can effectively reduce the closed loop bandwidth of the operational amplifier of the subsequent stage by a factor of as much as 2.5. This may be a problem in high speed applications due to the increased roll off of the closed loop gain at high frequencies. FIG. 6 illustrates one embodiment of a sampling network that reduces this effect. As illustrated in FIG. 6, the input sampled from the input to the operational amplifier on line 427 is amplified by amplifier 529 with a gain of negative one (−1). The sampling capacitor 604 receives a sample from switch 602 and 614 during $\phi_2$. During $\phi_1$ the switching capacitor 604 is connected across a unity gain buffer amplifier 606 by switch 608. At the same time the input node 612 of the unity gain buffer amplifier 606 is coupled to the input node of the subsequent stage operational amplifier. The combination of sampling capacitor 604 and the unity gain buffer 606 act as a current source that inherently has a high output impedance and will not affect the closed loop bandwidth of the next stage, while still providing the necessary signal to the subsequent stage.

Although the preselected first stage and the subsequent stage that receives the feed-forward error correction signal are illustrated as being adjacent stages, one or more stages may separate the pre-selected first stage and the subsequent stage. If there are J stages separating the first stage and the subsequent stage, then to properly subtract the correct gain amount from the subsequent stage, the amplifier 520 in FIGS. 5 and 6 will have a gain of $-J*2^N$, where N is the number of bits output at each stage of the pipelined ADC. In addition, in the pipelined ADC the output residue voltage decreases for each processing stage until ideally it is zero (0) at the output of the final stage. Since the errors produced by the non-ideal characteristics are not large, with each subsequent stage the error decreases as the output residue voltage decreases. As such, depending on the accuracy required of the application of the pipelined ADC, the feed-forward error correction signal may only be necessary to include in the first few stages of the pipelined ADC.

Figure 7:
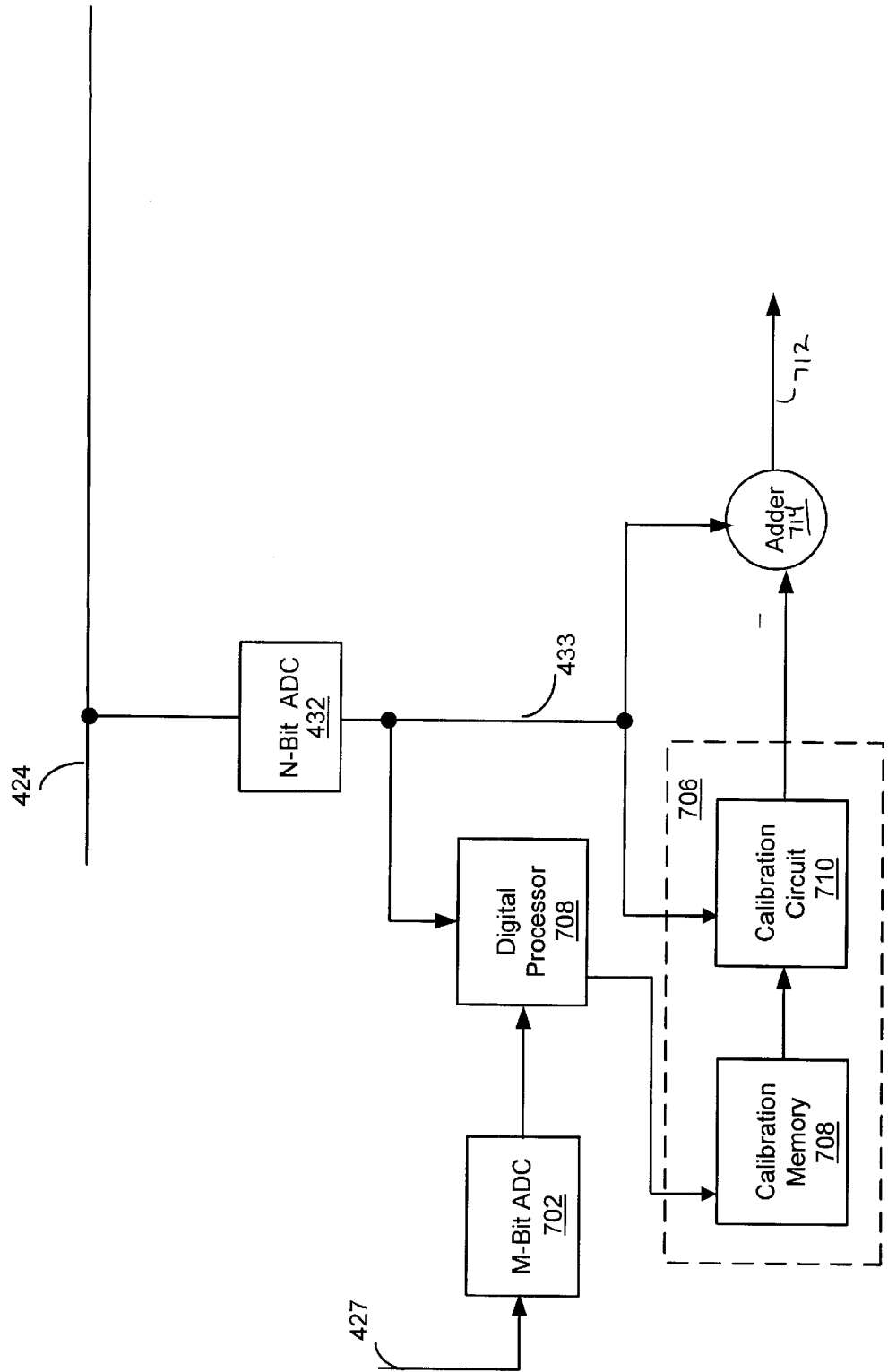
FIG. 7 is a schematic diagram of another embodiment of a sampling network suitable for use with the electronic circuit of FIG. 5.

FIG. 7 illustrates another embodiment of a sampling network suitable for use in the present invention. In this embodiment, a digital processor determines the gain of the operational amplifier in amplifier assembly 406 and this gain is used to determine the correction signal to be subtracted from the digital output of that stage. In this embodiment, the error correcting signal is produced in the digital domain and subtracted directly from the digital representation of the input signal provided by that particular stage.

A low-rate M-Bit ADC 702 is used to sample the input to the operational amplifier 502 on line 427. The M-Bit ADC 702 can be a low rate ADC such as a sigma-delta converter or a cyclic ADC. In addition, the ADC 702 can be a low resolution ADC since the error being corrected is typically small. The digital processor 704 receives both the N-bit output signal of ADC 401 and the digital output of the M-bit low rate ADC 702. The gain of the operational amplifier 502 can be calculated directly by dividing the N bit output signal by the digital output signal of the low rate ADC 432. This gain value is provided to a sampling signal generator 706 that also receives the N-bit output signal of the ADC 432. The sampling signal generator 706 provides a correction signal to a digital adder module 714 that will subtract the calibration value from the N-bit output value for that stage on line 712.

The sampling signal generator 706 includes a digital calibration memory 708 that stores a plurality of correction values where each correction value corresponds to a one of a plurality of gain values. The calibration circuit 710 receives the correction values and provides an output of digital words to correct the output of a particular stage. This embodiment can correct the output of more than one stage using a single processor 704, memory 708, and calibration circuit 710 by providing the necessary logic to sample one stage at a time within the time requirements of the overall pipelined ADC.

Those of ordinary skill in the art should further appreciate that variations to and modification of the above-described methods and systems for overcoming finite amplifier gain in pipelined analog to digital converters may be made without departing from the inventive concepts disclosed herein. Accordingly, the invention should be viewed as limited solely by the scope spirit of the appended claims.

What is claimed is:

1. A pipelined analog-to-digital converter comprising:
   a plurality of stages, each stage having a stage input and a stage output, the stage input receiving a stage input signal and the output providing a residue output signal;

each stage including:
an analog-to-digital converter having an input and an output, the input coupled to the stage input and the analog-to-digital converter configured and arranged to provide as an output an N-bit digital output signal representative of the input signal;
a digital-to-analog converter having an input and an output, the input sampling the N-bit to digital output signal, the digital-to-analog converter configured and arranged to provide as an output an analog output signal representative of the digital output signal;
a subtraction module configured and arranged to subtract the analog output signal from the input signal and to provide a subtracted analog signal;
an amplifier assembly having a gain factor of $2^N$, the amplifier assembly having an input coupled to the subtracted analog signal, and the amplifier assembly configured and arranged to provide as an output signal the residue output signal output of the stage that is equal to the amplified subtracted analog signal;
a sampling network including a sampled signal input coupled to the input of the amplifier assembly, and an output, and the sampling network configured and arranged to provide a feed-forward error correction signal that is the negative of the sampled signal to the subtraction module of a subsequent stage.

2. The apparatus of claim 1, wherein the subtraction and amplifier assemblies includes:
an operational amplifier having first and second inputs and an output;
a first input network coupling the input signal to the first input, and a second input network coupling the analog output signal to the first input;
the second input coupled to an electrical ground
a feedback network sampling a portion of the signal present on the output and providing the sampled portion to the first input; and
wherein the first input network, the second input network, the feedback network, and the operational amplifier configured and arranged to provide a gain of $2^N$.

3. The apparatus of claim 2, wherein the operational amplifier, the first input network, the second input network, and the feedback network are configured and arranged as a difference amplifier with a gain of $2^N$.

4. The apparatus of claim 2, wherein the operational amplifier the first input network, the second input network, the feedback network are configured and arranged as a switched capacitor difference amplifier with a gain of $2^N$.

5. The apparatus of claim 1, wherein the sampling assembly includes a sampling amplifier having a gain of –1 and the sampling amplifier having an input coupled to the input of the amplifier assembly and output coupled to a sample and hold network.

6. The apparatus of claim 5 wherein the sample and hold network is a switched capacitor sample and hold network.

7. The apparatus of claim 5 wherein the sample and hold network includes a first switch having a first switching phase, the first switch coupling the output of the sampling amplifier to a sampling capacitor that has a first and second connection, a feedback amplifier having a gain of 1 having an input coupled to first connection of the sampling capacitor and an output coupled to a second switch having a second switching phase opposite to the first switching phase, the second switch coupling the output of the feedback amplifier to the second connection of the sampling capacitor.

8. The apparatus of claim 1 wherein the sampling network includes a sampling analog to digital converter coupled to the input of the sampling network and providing a M-bit digital output representative of the input signal to the amplifier assembly, a sampling signal generator having a first input coupled to the N-bit digital output signal representative of the subsequent stage, and a second input coupled to the M-bit digital output representative of the input signal to the amplifier assembly and providing the output signal of the sampling network.

9. The apparatus of claim 8 wherein the sampling signal generator includes a digital processor coupled to the N-bit digital output signal representative of the subsequent stage, and to the M-bit digital output representative of the input signal to the amplifier assembly, the digital processor providing an output value of the gain of the operational amplifier, a calibration memory coupled to the output of the digital processor to provide a correction value corresponding to the value of the gain of the operational amplifier, a calibration circuit coupled to the N-bit digital output signal representative of the subsequent stage and to the output of the calibration memory and providing a correction signal that is subtracted from the N-bit digital output signal.

10. The apparatus of claim 1 wherein the first and second stages are separated by J stages.

11. The apparatus of claim 10 wherein the feed-forward correction signal is multiplied by a gain of $J*2^N$.

12. The apparatus of claim 1, wherein N is equal to one.

13. The apparatus of claim 1, wherein N is equal to 1.5.

14. The apparatus of claim 1, wherein N is equal to two.

15. The apparatus of claim 1 wherein the first and second stages are adjacent stages in the pipelined analog to digital converter.

16. A pipelined analog-to-digital converter comprising:
a plurality of stages, each stage having a stage input and a stage output, the initial stage of the plurality of stages coupled to an input signal, wherein each subsequent stage receives the stage output residue signal of the previous stage as a stage input signal, each stage including an amplifier circuit that provides the stage output residue signal, the amplifier circuit including a plurality of electronic components and a N-bit analog-to-digital converter providing an N-bit output for the particular stage;
a compensation module of the first stage coupled to the input of the amplifier circuit and coupled the second stage subsequent to said first stage, wherein the feed-forward compensation module of the first stage provides a feed-forward compensation signal to the second stage to remove the stage output residue signal portions of the stage output residue signal contributed by the non-ideal operation of the plurality of electronic components of the amplifier circuit that provides the stage output residue signal in the first stage.

17. The pipelined analog to digital converter of claim 16 wherein the plurality of electronic components includes an operational amplifier having first and second inputs, the operational amplifier and a plurality of associated components coupled together forming an amplifier having a first gain.

18. The pipelined analog to digital converter of claim 17, wherein the feed-forward compensation signal is sampled from the first input of the of the operational amplifier of the first stage and provided to the first input of the operational amplifier of the second stage.

19. A pipelined analog-to-digital converter comprising:
a plurality of stages, each stage having a stage input and a stage output, the initial stage of the plurality of stages coupled to an input signal, wherein each subsequent stage receives the stage output residue signal of the previous stage as a stage input signal, each stage including an amplifier circuit that provides the stage output residue signal, the amplifier circuit including a plurality of electronic components and a N-bit analog-to-digital converter providing an N-bit output for the particular stage;

a compensation module of the first stage coupled to the input of the amplifier circuit and wherein the input to the first input of the operational amplifier is sampled, a processor coupled to the sampled input of the first operational amplifier wherein the processor computes the gain of the operational amplifier, a calibration memory coupled to the processor and stores a plurality of correction factors each corresponding to at least one of a plurality of gain values, wherein the memory retrieves a correction factor based on the input gain value, a calibration circuit coupled to memory to receive the correction factor, and the calibration circuit further coupled to the N-bit digital output of the first stage, and configured and arranged to provide a digital correction value that is subtracted from the N-bit digital output of the particular stage, wherein the digital correction value of removes the error in the N-bit digital output that is contributed by the non-ideal operation of the plurality of electronic components of the amplifier circuit in the first stage.

* * * * *